(12) United States Patent
Huang et al.

(10) Patent No.: US 9,368,602 B2
(45) Date of Patent: Jun. 14, 2016

(54) METHOD FOR FABRICATING IGZO LAYER AND TFT

(71) Applicant: EverDisplay Optronics (Shanghai) Limited, Shanghai (CN)

(72) Inventors: Chia-chi Huang, Shanghai (CN); Min-ching Hsu, Shanghai (CN); Hsueh-ming Tsai, Shanghai (CN); Wen-xia Zuo, Shanghai (CN)

(73) Assignee: EverDisplay Optronics (Shanghai) Limited, Shanghai (CN)

( * ) Notice: Subject to any disclaimer, the term of this patent is extended or adjusted under 35 U.S.C. 154(b) by 0 days.

(21) Appl. No.: 14/318,178

(22) Filed: Jun. 27, 2014

(65) Prior Publication Data
US 2015/0011047 A1 Jan. 8, 2015

(30) Foreign Application Priority Data

Jul. 5, 2013 (CN) .......................... 2013 1 0281940

(51) Int. Cl.
| | | |
|---|---|---|
| H01L 21/00 | (2006.01) | |
| H01L 21/16 | (2006.01) | |
| H01L 21/44 | (2006.01) | |
| H01L 29/66 | (2006.01) | |
| H01L 29/786 | (2006.01) | |

(52) U.S. Cl.
CPC ...... *H01L 29/66742* (2013.01); *H01L 29/7869* (2013.01)

(58) Field of Classification Search
CPC . H01L 51/56; H01L 51/0072; H01L 51/5016; H01L 51/0085; H01L 29/7869; H01L 29/66969; H01L 29/78693; H01L 27/1225; H01L 21/02565; G06F 3/044

USPC .......................... 438/22, 104, 597, 608, 609; 257/E33.062–E33.064, 257/E31.124–E31.126

See application file for complete search history.

(56) References Cited

U.S. PATENT DOCUMENTS 5,252,177 A * 10/1993 Hong et al. ................... 438/635
2011/0065216 A1 * 3/2011 Kaji et al. ....................... 438/16

(Continued)

FOREIGN PATENT DOCUMENTS

TW 201234479 A 8/2012

OTHER PUBLICATIONS

Office Action issued Apr. 22, 2015 by the TW Office.

*Primary Examiner* — Calvin Choi
(74) *Attorney, Agent, or Firm* — Yungling Ren; Eaton & Van Winkle

(57) ABSTRACT

Methods for fabricating an IGZO layer and fabricating TFT are provided in the present invention. The method for fabricating TFT includes the following steps: (1) depositing an IGZO layer and forming a surface oxidizing gas protective layer on the IGZO layer; (2) coating the IGZO layer with a photoresist, and then subjecting the photoresist to an exposing and developing process to form a photoresist pattern; and (3) subjecting the IGZO layer to an etching process, and then removing the photoresist. By forming an oxidizing gas protective layer, the present methods for fabricating an IGZO layer and fabricating TFT can effectively reduce the effect of hydrogen atom on IGZO layer and avoid the change of IGZO layer from semiconductor to conductor, thereby improving the stability of the IGZO layer and thus the TFT, and reducing the negative bias of threshold voltage generated by the long-term continuous use of the device.

18 Claims, 2 Drawing Sheets

(56) References Cited

U.S. PATENT DOCUMENTS

| | | | |
|---|---|---|---|
| 2011/0124153 A1* | 5/2011 | Hosoba et al. | 438/104 |
| 2011/0193194 A1* | 8/2011 | Takahashi | H01G 4/008 257/532 |
| 2011/0309353 A1* | 12/2011 | Kaneko et al. | 257/43 |
| 2012/0181532 A1 | 7/2012 | Lin | |
| 2014/0042427 A1* | 2/2014 | Hung et al. | 257/43 |

* cited by examiner

METHOD FOR FABRICATING IGZO LAYER AND TFT

CROSS-REFERENCE TO RELATED APPLICATIONS

This application claims the benefit of Chinese Patent Application No. 201310281940.8, filed on Jul. 5, 2013 and entitled "METHOD FOR FABRICATING IGZO LAYER AND TFT", the content of which is incorporated by reference herein in its entirety.

TECHNICAL FIELD

The present application relates to the field of semiconductor, particularly to a method for fabricating IGZO layer and TFT.

BACKGROUND

Flexible transparent thin film transistor (TFT) based on indium gallium zinc oxide (IGZO) was first reported by Hosono at Tokyo Institute of Technology, Japan in 2004. Since then IGZO-TFT had attracted much attention from both academic institutes and industry. Its application in the field of display technologies, especially in new display equipments, has been explored.

As a new type of passively driven circuit, IGZO-TFT is used in flat panel display devices, but there are still many problems to be resolved before it enters the commercialization stage.

IGZO layer is very sensitive to the process conditions, particularly to the hydrogen atoms in the air. The hydrogen atoms may cause the electrical properties of the device to change and even change the passive layer from semiconductor to conductor. A protective layer is usually plated on top of the IGZO layer. $SiN_x$ prepared by plasma enhanced chemical vapor deposition (PECVD) is generally used as the protective layer for the commercial amorphous silicon TFT. However, $SiN_x$ is not able to be used as the protective layer for IGZO-TFT, because the $SiN_x$ prepared by PECVD contains a large number of hydrogen atoms. The protective layer currently used for IGZO layer is $SiO_x$, which is prepared by plasma enhanced chemical vapor deposition (PECVD).

In the fabrication of the IGZO layer, however, there still involved such non-vacuum processes as photoresist coating, exposure, and development, and a certain amount of hydrogen atoms may exist in these processes. Also, in the subsequent PECVD coating of $SiO_x$, there may be present some hydrogen atoms either. These hydrogen atoms are likely to affect the performance of IGZO layer, and no solution to solve this problem has been found yet.

SUMMARY OF THE INVENTION

In order to overcome the problem mentioned above, the present inventor found that the separation of the IGZO layer from these hydrogen atoms can be achieved by introducing an oxidizing gas, which will form an oxidizing gas protective layer, and the stability of the IGZO layer and thus the TFT can be improved accordingly.

One object of the present invention is to provide a method for fabricating TFT, including the following steps:
(1) depositing an IGZO layer and forming a surface oxidizing gas protective layer on the IGZO layer;

(2) coating the IGZO layer with a photoresist, and then subjecting the photoresist to an exposing and developing process to form a photoresist pattern; and (3) subjecting the IGZO layer to an etching process, and then removing the photoresist.

According to some embodiments, the IGZO layer is deposited using PVD (physical vapor deposition).

According to some embodiments, the surface oxidizing gas protective layer is formed by inversing the target after the deposition of the IGZO layer and introducing oxygen at the same time.

According to some embodiments, t the oxygen is introduced at a flow of 10 to 20 sccm (standard-state cubic centimeter per minute).

According to some embodiments, the oxygen is introduced for 1 to 10 seconds.

According to some embodiments, the surface oxidizing gas protective layer is formed by introducing a gas mixture of oxygen and argon after the deposition of the IGZO layer.

According to some embodiments, the flow ratio of oxygen to argon in the mixture is from 1:10 to 1:100.

According to some embodiments, the gas mixture of oxygen and argon is introduced for 1 to 10 seconds.

According to some embodiments, the etching process is dry etching.

According to some embodiments, the method further includes introducing a first oxidizing gas to form a side oxidizing gas protective layer while removing the photoresist.

According to some embodiments, the photoresist is removed by ashing.

According to some embodiments, the first oxidizing gas is selected from the group consisting of nitrogen monoxide ($N_2O$), ozone and oxygen.

According to some embodiments, the first oxidizing gas is introduced at a flow of 500 to 1000 sccm.

According to some embodiments, the first oxidizing gas is introduced for 1 to 10 seconds.

According to some embodiments, the present method further includes annealing the IGZO layer and/or introducing a second oxidizing gas into the IGZO layer after the step (3).

According to some embodiments, the annealing is carried out under an atmosphere of nitrogen monoxide or oxygen.

According to some embodiments, the annealing is carried out at a temperature of 300 to 450° C.

According to some embodiments, the annealing is carried out for 10 to 15 minutes.

According to some embodiments, the second oxidizing gas is selected from the group consisting of nitrogen monoxide ($N_2O$), ozone and oxygen.

According to some embodiments, the second oxidizing gas is introduced at a flow of 20 to 40 liters per minute.

According to some embodiments, the second oxidizing gas is introduced for 1 to 10 seconds.

Another object of the present invention is to provide a method for fabricating IGZO layer, including the following steps: (1) depositing an IGZO layer and forming a surface oxidizing gas protective layer on the IGZO layer; (2) coating the IGZO layer with a photoresist, and then subjecting the photoresist to an exposing and developing process to form a photoresist pattern; and (3) subjecting the IGZO layer to an etching process, and then removing the photoresist.

By forming an oxidizing gas protective layer, the present methods for fabricating an IGZO layer and fabricating TFT can effectively reduce the effect of hydrogen atom on IGZO layer and avoid the change of IGZO layer from semiconductor to conductor, thereby improving the stability of the IGZO layer and thus the TFT, and reducing the negative bias of threshold voltage generated by the long-term continuous use of the device.

DETAILED DESCRIPTION

Figure 1:
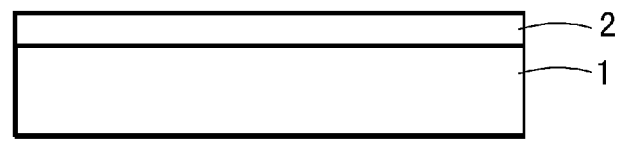
FIG. 1 is a schematic view showing the surface oxidizing gas protective layer on the IGZO layer according to an embodiment of the present invention.

The present invention will be further illustrated according to the following embodiments. It should be understood that these embodiments are only illustrative rather than limited to the present invention.

In a preferred embodiment of the present invention, the method for fabricating TFT includes the following steps:
(1) depositing an IGZO layer and forming a surface oxidizing gas protective layer on the IGZO layer;
(2) coating the IGZO layer with a photoresist, and then subjecting the photoresist to an exposing and developing process to form a photoresist pattern; and
(3) subjecting the IGZO layer to an etching process, and then removing the photoresist.

PVD is preferred for depositing the IGZO layer. PVD refers to a process that uses physical processes to achieve the mass transfer and transfers the atoms or molecules from the source onto the substrate surface. The function of PVD is to make particles with certain special properties (strength, wear resistance, heat resistance, corrosion resistance etc.) sprayed on a matrix with lower performance such that the matrix obtains a better performance. PVD methods typically comprise vacuum evaporation, sputtering, and ion plating.

The method according to the present invention uses magnetron sputtering deposition to deposit the IGZO layer. The magnetron sputtering deposition process is carried out under a relatively stable vacuum condition. The cathode target is made from coating material. When sputtering, a flow of argon gas is introduced into the vacuum chamber and glow discharge occurs under a DC negative high voltage between the cathode and the anode or a radio-frequency voltage with a frequency of 13.56 MHz The glow discharge leads to the ionization of argon atoms between two electrodes, thereby generating argon ions and electrons. Argon ions are accelerated under the electric field and bombard the target, such that a large number of neutral target atoms are sputtered onto a substrate on the anode surface to form a film. During the process of accelerating to the substrate under the electric field, the electrons are exposed to a magnetic field (Lorentz force), which causes the electrons to be trapped in the plasma area near the target surface and move in a circular motion. Due to the quite long motion path of the electrons, in this process, the electrons continually collide with the argon atoms, generating electrons and argon ions, and the argon ions continuously bombard the target, so that a high-speed deposition is achieved. The secondary electrons play a role in maintaining a glow discharge.

Compared with other coating methods, magnetron sputtering deposition has the following advantages: good film adhesion, good uniformity, easy to achieve a large area film, conveniently for preparing high melting point metal thin film at ambient temperature, and good reproducibility for preparing film, but it also has some deficiencies such as expensive target and low utilization.

The surface oxidizing gas protective layer may be formed by inversing the target after the deposition of the IGZO layer and introducing oxygen at the same time, wherein the oxygen is introduced at a flow of 10 to 20 sccm for 1-10 s. The surface oxidizing gas protective layer also may be formed by introducing a gas mixture of oxygen and argon with a flow ratio of 1:10 to 1:100 for 1-10 s after the deposition of the IGZO layer.

The IGZO layer is protected by the surface oxidizing gas protective layer from hydrogen atoms, which can effectively minimize the reducing effect of hydrogen atom on the IGZO layer. During the process of forming the surface oxidizing gas protective layer, the flow of oxygen cannot be too high. The excess oxygen molecules will fill the oxygen vacancies in the semiconductor layer, so that the resistivity of IGZO layer is increased and the conductivity mobility of IGZO layer is decreased.

The IGZO layer is preferably etched by a dry etching process. Dry etching is an etching technology for thin film using plasma. When the gas is present in the form of plasma, it has two characteristics: in one aspect, the chemical activity of these gases in the form of plasma is much stronger than that under normal conditions, and the appropriate gas is selected based on the different materials to be etched, so that the gas can react more quickly with materials to achieve the purpose of removing and etching; in another aspect, the plasma can be guided and accelerated by electric field to obtain a certain energy, and the plasma may knock out the atoms of the etched material when bombarding the etched surface, so that the purpose of etching by energy transfer in physical is achieved.

Since the surface oxidizing gas protective layer of the IGZO layer is partly damaged in etching process and the sides of the IGZO layer are exposed, a first oxidizing gas may be introduced while removing the photoresist to form a side oxidizing gas protective layer and effectively protect the sides of the IGZO layer. The photoresist may be removed by ashing. The first oxidizing gas may be selected from a group consisting of nitrogen monoxide, ozone and oxygen. The first oxidizing gas is introduced at a flow of 500 to 1000 sccm for 1-10s.

The IGZO layer is annealed after the step (3). The annealing causes the remaining hydrogen atoms in the IGZO layer to migrate to the surface and combine with oxygen atoms, and thereby further minimizes hydrogen atoms in the IGZO layer and improves the stability of the IGZO layer. The annealing is carried out under an atmosphere of nitrogen monoxide or oxygen at 300 to 450° C. for 10-15 minutes.

A second oxidizing gas is introduced after the step (3). During the following deposition of $SiO_x$ protective layer, the second oxidizing gas can effectively reduce the effect of hydrogen atoms in $SiH_4$ on IGZO performance. The second oxidizing gas may be selected from the group consisting of nitrogen monoxide, ozone and oxygen, and be introduced at a flow of 20 to 40 liters per minute for 1-10 s.

Another object of the present invention is to provide a method for fabricating IGZO layer, including: (1) depositing an IGZO layer and forming a surface oxidizing gas protective layer on the IGZO layer; (2) coating the IGZO layer with a photoresist, and then subjecting the photoresist to an exposing and developing process to form a photoresist pattern; and (3) subjecting the IGZO layer to an etching process, and then removing the photoresist.

The compositions of the IGZO layer are not specifically limited in the method according to the present invention.

The terms used herein each have usual means appreciated by the skilled person in the art, except otherwise indicated.

The present invention will be described in more detail with reference to the drawings and examples. It should be understood that the examples are provided for illustrating rather than limiting the present application.

EXAMPLE 1

Figure 2:
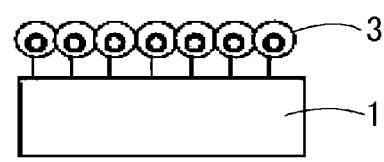
FIG. 2 is a schematic view showing the surface oxidizing gas protective layer on the IGZO layer according to an embodiment of the present invention.

In a vacuum chamber, an IGZO layer 1 was deposited on the gate insulating layer of an IGZO TFT using a magnetron sputtering apparatus (G4.5 SMD950, manufactured by ULVAC, Japan). The target was inversed after the deposition of the IGZO layer 1 and oxygen was introduced at the same time to form a surface oxidizing gas protective layer 2 on the IGZO layer 1 (as shown in FIG. 1). Specific operation parameters were shown in Table 1 below. Oxygen atoms 3 were chemically bonded to IGZO layer 1 (as shown in FIG. 2).

TABLE 1 operation parameters for the magnetron sputtering deposition and the formation of the surface oxidizing gas protective layer

| | Vacuum degree (Pa) | Argon flow (Sccm) | Oxygen flow (Sccm) | Power (KW) | Temperature (° C.) | Time (Seconds) | Thickness (Nm) |
|---|---|---|---|---|---|---|---|
| Magnetron sputtering deposition | 6 × 10⁻⁴ | 100 | 20 | 300 | 25 | 20 | 50 |
| Formation of the surface oxidizing gas protective layer | 6 × 10⁻⁴ | — | 20 | 100 | 25 | 2 | — |

Figure 3:
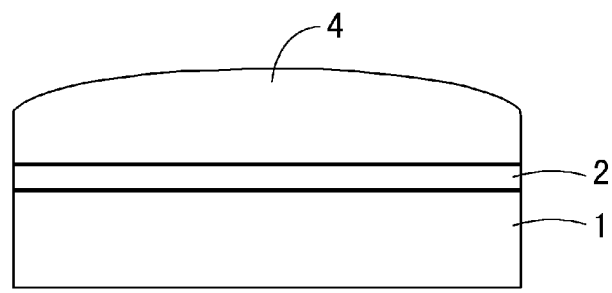
FIG. 3 is a schematic view showing coating the photoresist according to an embodiment of the present invention.
Figure 4:
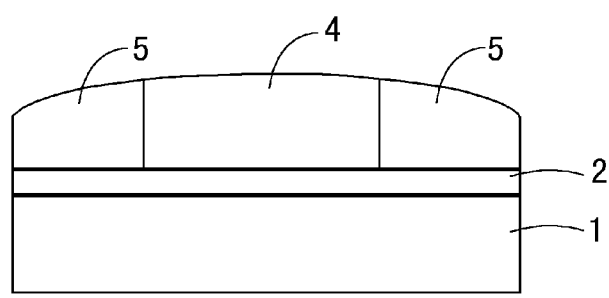
FIG. 4 is a schematic view showing exposing the photoresist according to an embodiment of the present invention.
Figure 5:
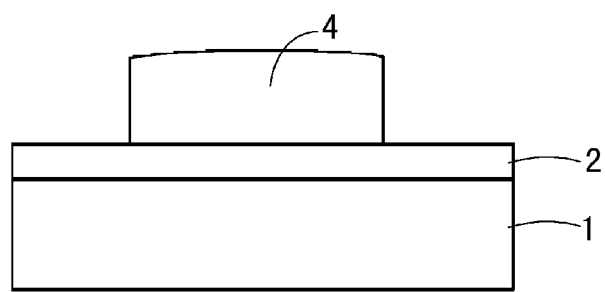
FIG. 5 is a schematic view showing developing the photoresist according to an embodiment of the present invention.

Next, the IGZO layer was coated with photoresist 4 (as shown in FIG. 3). Then, the photoresist 4 was subjected to an exposing process (as shown in FIG. 4), and part of the photoresist 4 was transformed into exposed photoresist 5 after exposing. Subsequently, the exposed IGZO layer was subjected to a developing process (as shown in FIG. 5), and the exposed photoresist 5 was removed. Operation parameters for coating the photoresist were shown in Table 2 below, and operation parameters for exposing and developing the photoresist were shown in Table 3 below.

TABLE 2 operation parameters for coating the photoresist

| Order | Rotating speed (rpm) | Time (seconds) |
|---|---|---|
| 1 (low speed) | 300 | 3 |
| 2 (high speed) | 3000 | 40 |

TABLE 3 operation parameters for exposing and developing the photoresist

| Exposure intensity (mW/m²) | Exposure time (Seconds) | Developer | Development time (Seconds) | Development temperature (° C.) |
|---|---|---|---|---|
| 10 | 27 | 0.5% NaOH | 35 | 25 |

Figure 6:
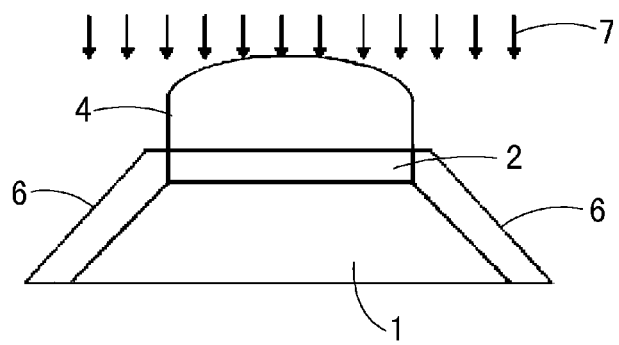
FIG. 6 is a schematic view showing the side oxidizing gas protective layer on the IGZO layer according to an embodiment of the present invention.

In a vacuum chamber, the developed IGZO layer was dry etched using a dry etching machine (G4.5 HT910, manufactured by TEL, Japan), followed by an ashing process to remove the photoresist. Ozone 7 was introduced at a flow of 1000 sccm for 4 seconds when ashing, to form a side oxidizing gas protective layer 6 on the side of the IGZO (as shown in FIG. 6).

Figure 7:
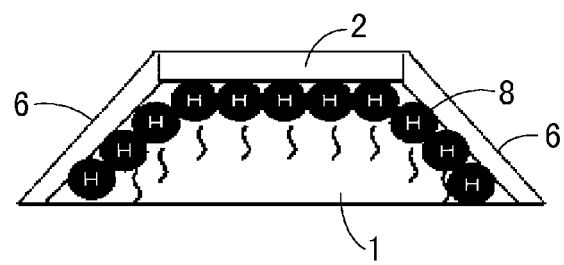
FIG. 7 is a schematic view showing the annealing according to an embodiment of the present invention.

After removing the photoresist, IGZO layer 1 was annealed under a nitrogen monoxide atmosphere at a temperature of 450° C. for 10 minutes, so that hydrogen atoms migrated to the surface of IGZO and combined with oxygen atoms (as shown in FIG. 7).

Finally, ozone was introduced to the annealed IGZO layer at a flow of 40 liters per minute for 4 seconds.

EXAMPLE 2

In a vacuum chamber, an IGZO layer was deposited on the gate insulating layer of an IGZO TFT using a magnetron sputtering apparatus (G4.5 SMD950, manufactured by ULVAC, Japan). A gas mixture of oxygen and argon with a flow ratio of 1:100 was introduced after the deposition of the IGZO layer to form a surface oxidizing gas protective layer. Specific operation parameters were shown in Table 4 below.

TABLE 4 operation parameters for the magnetron sputtering deposition and the formation of the surface oxidizing gas protective layer

| | Vacuum degree (Pa) | Argon flow (Sccm) | Oxygen flow (Sccm) | Power (KW) | Temperature (° C.) | Time (seconds) | Thickness (nm) |
|---|---|---|---|---|---|---|---|
| Magnetron sputtering deposition | 6 × 10⁻⁴ | 100 | 20 | 300 | 25 | 20 | 50 |
| Formation of the surface oxidizing gas protective layer | 6 × 10⁻⁴ | 100 | 1 | 100 | 25 | 2 | — |

Next, the IGZO layer was coated with photoresist. Then, the photoresist was subjected to an exposing process, and part of the photoresist was transformed into exposed photoresist after exposing. Subsequently, the exposed IGZO layer was subjected to a developing process, and the exposed photoresist was removed. The operation parameters for coating, exposing and developing the photoresist were the same as in Example 1.

In a vacuum chamber, the developed IGZO layer was dry etched using a dry etching machine (G4.5 HT910, manufactured by TEL, Japan), followed by an ashing process to remove the photoresist. Nitrogen monoxide was introduced at a flow of 1000 sccm for 4 seconds when ashing, to form a side oxidizing gas protective layer on the side of the IGZO.

After removing the photoresist, the IGZO layer was annealed under an oxygen atmosphere at a temperature of 300° C. for 15 minutes, so that hydrogen atoms migrated to the surface of IGZO and combined with oxygen atoms.

Finally, nitrogen monoxide ozone was introduced to the annealed IGZO layer at a flow of 40 liters per minute for 4 seconds.

EXAMPLE 3

In a vacuum chamber, an IGZO layer was deposited on the gate insulating layer of an IGZO TFT using a magnetron sputtering apparatus (G4.5 SMD950, manufactured by ULVAC, Japan). The target was inversed after the deposition of the IGZO layer and oxygen was introduced at the same time to form a surface oxidizing gas protective layer on the IGZO layer. Operation parameters for the magnetron sputtering deposition and the formation of the surface oxidizing gas protective layer were the same as in Example 1, except that the oxygen was introduced at a flow of 15 sccm when forming the surface oxidizing gas protective layer.

Next, the IGZO layer was coated with photoresist. Then, the photoresist was subjected to an exposing process, and part of the photoresist was transformed into exposed photoresist after exposing. Subsequently, the exposed IGZO layer was subjected to a developing process, and the exposed photoresist was removed. The operation parameters for coating, exposing and developing the photoresist were the same as in Example 1.

In a vacuum chamber, the developed IGZO layer was dry etched using a dry etching machine (G4.5 HT910, manufactured by TEL, Japan), followed by an ashing process to remove the photoresist. Oxygen was introduced at a flow of 750 sccm for 6 seconds when ashing, to form a side oxidizing gas protective layer on the side of the IGZO.

After removing the photoresist, the IGZO layer was annealed under a nitrogen monoxide atmosphere at a temperature of 420° C. for 11 minutes, so that hydrogen atoms migrated to the surface of IGZO and combined with oxygen atoms.

Finally, oxygen was introduced to the annealed IGZO layer at a flow of 30 liters per minute for 6 seconds.

EXAMPLE 4

In a vacuum chamber, an IGZO layer was deposited on the gate insulating layer of an IGZO TFT using a magnetron sputtering apparatus (G4.5 SMD950, manufactured by ULVAC, Japan). A gas mixture of oxygen and argon was introduced after the deposition of the IGZO layer to form a surface oxidizing gas protective layer. Operation parameters for the magnetron sputtering deposition and the formation of the surface oxidizing gas protective layer were the same as in Example 2, except that the flow of oxygen introduced when forming the surface oxidizing gas protective layer was 10 sccm, so that the flow ratio of oxygen to argon in the gas mixture was 1:10.

Next, the IGZO layer was coated with photoresist. Then, the photoresist was subjected to an exposing process, and part of the photoresist was transformed into exposed photoresist after exposing. Subsequently, the exposed IGZO layer was subjected to a developing process, and the exposed photoresist was removed. The operation parameters for coating, exposing and developing the photoresist were the same as in Example 1.

In a vacuum chamber, the developed IGZO layer was dry etched using a dry etching machine (G4.5 HT910, manufactured by TEL, Japan), followed by an ashing process to remove the photoresist. Ozone was introduced at a flow of 750 sccm for 6 seconds when ashing, to form a side oxidizing gas protective layer on the side of the IGZO.

After removing the photoresist, the IGZO layer was annealed under an oxygen atmosphere at a temperature of 330° C. for 14 minutes, so that hydrogen atoms migrated to the surface of IGZO and combined with oxygen atoms Finally, ozone was introduced to the annealed IGZO layer at a flow of 30 liters per minute for 6 seconds.

EXAMPLE 5

In a vacuum chamber, an IGZO layer was deposited on the gate insulating layer of an IGZO TFT using a magnetron sputtering apparatus (G4.5 SMD950, manufactured by ULVAC, Japan). The target was inversed after the deposition of the IGZO layer and oxygen was introduced at the same time to form a surface oxidizing gas protective layer on the IGZO layer. Operation parameters for the magnetron sputtering deposition and the formation of the surface oxidizing gas protective layer were the same as in Example 1, except that the oxygen was introduced at a flow of 10 sccm when forming the surface oxidizing gas protective layer.

Next, the IGZO layer was coated with photoresist. Then, the photoresist was subjected to an exposing process, and part of the photoresist was transformed into exposed photoresist after exposing. Subsequently, the exposed IGZO layer was subjected to a developing process, and the exposed photoresist was removed. The operation parameters for coating, exposing and developing the photoresist were the same as in Example 1.

In a vacuum chamber, the developed IGZO layer was dry etched using a dry etching machine (G4.5 HT910, manufactured by TEL, Japan), followed by an ashing process to remove the photoresist. Nitrogen monoxide was introduced at a flow of 500 sccm for 8 seconds when ashing, to form a side oxidizing gas protective layer on the side of the IGZO.

After removing the photoresist, the IGZO layer was annealed under an oxygen atmosphere at a temperature of 390° C. for 12 minutes, so that hydrogen atoms migrated to the surface of IGZO and combined with oxygen atoms Finally, nitrogen monoxide was introduced to the annealed IGZO layer at a flow of 20 liters per minute for 8 seconds.

EXAMPLE 6

In a vacuum chamber, an IGZO layer was deposited on the gate insulating layer of an IGZO TFT using a magnetron sputtering apparatus (G4.5 SMD950, manufactured by ULVAC, Japan). A gas mixture of oxygen and argon was introduced after the deposition of the IGZO layer to form a surface oxidizing gas protective layer. Operation parameters for the magnetron sputtering deposition and the formation of the surface oxidizing gas protective layer were the same as in Example 2, except that the flow of oxygen introduced when forming the surface oxidizing gas protective layer was 5 sccm, so that the flow ratio of oxygen to argon in the gas mixture was 1:20.

Next, the IGZO layer was coated with photoresist. Then, the photoresist was subjected to an exposing process, and part of the photoresist was transformed into exposed photoresist after exposing. Subsequently, the exposed IGZO layer was subjected to a developing process, and the exposed photoresist was removed. The operation parameters for coating, exposing and developing the photoresist were the same as in Example 1.

In a vacuum chamber, the developed IGZO layer was dry etched using a dry etching machine (G4.5 HT910, manufactured by TEL, Japan), followed by an ashing process to remove the photoresist. Oxygen was introduced at a flow of 500 sccm for 8 seconds when ashing, to form a side oxidizing gas protective layer on the side of the IGZO.

After removing the photoresist, the IGZO layer was annealed under a nitrogen monoxide atmosphere at a temperature of 360° C. for 13 minutes, so that hydrogen atoms migrated to the surface of IGZO and combined with oxygen atoms.

Finally, oxygen was introduced to the annealed IGZO layer at a flow of 20 liters per minute for 8 seconds.

In summary, by forming an oxidizing gas protective layer, the present methods for fabricating an IGZO layer and fabricating TFT can effectively reduce the effect of hydrogen atom on IGZO layer and avoid the change of IGZO layer from semiconductor to conductor, thereby improving the stability of the IGZO layer and thus the TFT, and reducing the negative bias of threshold voltage generated by the long-term continuous use of the device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for fabricating TFT, including the steps of:
   (1) depositing an IGZO layer and forming a surface oxidizing gas protective layer on the IGZO layer, wherein the surface oxidizing gas protective layer is formed by introducing a gas mixture of oxygen and argon after the deposition of the IGZO layer;
   (2) coating the IGZO layer with a photoresist, and then subjecting the photoresist to an exposing and developing process to form a photoresist pattern; and
   (3) subjecting the IGZO layer to an etching process, and then removing the photoresist.

2. The method according to claim 1, wherein the IGZO layer is deposited using PVD.

3. The method according to claim 1, wherein the flow ratio of oxygen to argon in the mixture is from 1:10 to 1:100.

4. The method according to claim 3, wherein the gas mixture of oxygen and argon is introduced for 1 to 10 seconds.

5. The method according to claim 1, wherein the etching process is dry etching.

6. The method according to claim 1, further including introducing a first oxidizing gas to form a side oxidizing gas protective layer while removing the photoresist.

7. The method according to claim 6, wherein the photoresist is removed by ashing.

8. The method according to claim 6, wherein the first oxidizing gas is selected from the group consisting of nitrogen monoxide, ozone and oxygen.

9. The method according to claim 6, wherein the first oxidizing gas is introduced at a flow of 500 to 1000 sccm.

10. The method according to claim 9, wherein the first oxidizing gas is introduced for 1 to 10 seconds.

11. The method according to claim 6, further including annealing the IGZO layer and/or introducing a second oxidizing gas to the IGZO layer after removing the photoresist.

12. The method according to claim 11, wherein the annealing is carried out under an atmosphere of nitrogen monoxide or oxygen.

13. The method according to claim 11, wherein the annealing is carried out at a temperature of 300 to 450°.

14. The method according to claim 11, wherein the annealing is carried out for 10 to 15 minutes.

15. The method according to claim 11, wherein the second oxidizing gas is selected from the group consisting of nitrogen monoxide (N2O), ozone and oxygen.

16. The method according to claim 11, wherein the second oxidizing gas is introduced at a flow of 20 to 40 liters per minute.

17. The method according to claim 16, wherein the second oxidizing gas is introduced for 1 to 10 seconds.

18. A method for fabricating IGZO layer, including the steps of:
   (1) depositing an IGZO layer and forming a surface oxidizing gas protective layer on the IGZO layer, wherein the surface oxidizing gas protective layer is formed by introducing a gas mixture of oxygen and argon after the deposition of the IGZO layer;
   (2) coating the IGZO layer with a photoresist, and then subjecting the photoresist to an exposing and developing process to form a photoresist pattern; and
   (3) subjecting the IGZO layer to an etching process, and then removing the photoresist.

* * * * *